(12) United States Patent  
Chen

(10) Patent No.: US 7,262,971 B2  
(45) Date of Patent: Aug. 28, 2007

(54) MEMORY COOLING DEVICE

(75) Inventor: Wei-Hau Chen, Taipei (TW)

(73) Assignee: Comptake Technology Co., Ltd, Taipei (TW)

( * ) Notice: Subject to any disclaimer, the term of this patent is extended or adjusted under 35 U.S.C. 154(b) by 0 days.

(21) Appl. No.: 11/325,429

(22) Filed: Jan. 5, 2006

(65) Prior Publication Data

US 2007/0153486 A1    Jul. 5, 2007

(51) Int. Cl.
*H05K 7/20* (2006.01)
(52) U.S. Cl. ..................................... 361/719
(58) Field of Classification Search ............... 361/709, 361/707, 719, 720, 715; 257/718, 719; 165/80.3, 165/185; 174/16.1, 16.3
See application file for complete search history.

(56) References Cited

U.S. PATENT DOCUMENTS

2003/0076657 A1*  4/2003  Summers et al. ........... 361/719

* cited by examiner

*Primary Examiner*—Javaid H. Nasri
(74) *Attorney, Agent, or Firm*—Alan Kamrath; Kamrath & Associates PA

(57) ABSTRACT

A memory cooling device includes two symmetrically formed cooling foils, which sandwich a memory therebetween. The inner surfaces of the two cooling foils touch the two sides of the memory. Further, at least a folded portion formed on the cooling foils includes a buckling element and a buckling hole formed thereon. Therefore, the memory cooling device is structurally simple and easy to assemble, which can largely simplify the fabrication process thereof.

2 Claims, 4 Drawing Sheets

MEMORY COOLING DEVICE

BACKGROUND OF THE INVENTION (1) Field of the Invention

The present invention relates generally to a memory cooling device and, more particularly, to a memory cooling device that is easily and quickly assembled to a computer memory.

(2) Description of the Prior Arts

A conventional memory cooling device 30, as shown in FIG. 1, includes two heat conductive plastic foils 301, two cooling foils 302, and two clipping elements 303. The heat conductive plastic foils 301 are adhered to the inner surface of the cooling foils 302. A locking hook 302a and a locking hole 302b are formed on two sides of the upper portion of the cooling foil 302, respectively, thereby forming a space for situating therein a memory 20 when the two cooling foils 302 are locked with each other. A positioning foil 302d folded downward is formed at the central portion of the locking base 302c. The positioning foil 302d corresponds to the U-shaped restrictive groove 304 formed on the outer surface of the cooling foil 302. A buckling hole 305 is formed above the restrictive groove 304, while a guiding hole 306 is formed above the buckling hole 305, so as to allow the U-shaped clipping element 303 to ride on the positioning foil 302d. Further, the reverse hooks 303a formed on the two inner surfaces of the two clipping elements 303 are glided downward along the guiding hole 306 and are buckled in the buckling hole 305. The reverse hook 303a securely buckles the two cooling foils 302 contacting the memory 20. The heat generated from the memory 20 is, thus, rapidly dissipated through the cooling foils 302.

However, the conventional memory cooling device 30 described above has the following drawbacks:

1. In order for the two cooling foils 302 to securely contact the memory 20, the conventional memory cooling device 30 includes restrictive grooves 304, buckling holes 305 and guiding holes 306 on the cooling foils 302. The corresponding reverse hooks 303a are also formed on the clipping elements 303. Therefore, the fabrication of the conventional memory cooling device 30 is complicated and time consuming. The assembly of the conventional memory cooling device 30 is also very tedious.
2. The conventional memory cooling device 30 is not dust-proof. Therefore, dust can easily-intrude the gaps between the cooling foils 302 and the memory 20, thereby affecting the performance of the cooling foils 302 and the memory 20.

Accordingly, the present invention has developed solutions for the drawbacks mentioned above. Specifically, a new memory cooling device is developed.

SUMMARY OF THE INVENTION

One objective of the present invention is to provide a memory cooling device that is structurally simple and easy to assemble, which can largely simplify the manufacturing process thereof.

Another objective of the present invention is to provide a dust-proof cooling device, so as to prevent dust from intruding into the gaps between the memory and the cooling foils, thereby maintaining normal operations of the memory and the cooling device.

In order to achieve the above and other objectives, the memory cooling device of the present invention includes two symmetrically formed cooling foils, which sandwich a memory therebetween. The inner surfaces of the two cooling foils touch the two sides of the memory. Furthermore, at least a folded portion formed on the cooling foils includes a buckling element and a buckling hole formed thereon. The buckling element includes at least two insertion foils. The insertion foils are extended outward, so as to define a protrusive portion. In this manner, the protrusive portion can touch the side wall of the buckling hole when the insertion foil is inserted to its corresponding buckling base. Thus, the memory cooling device of the present invention is assembled quickly and easily. Moreover, an inwardly folded dust-proof flange is formed on the cooling foils, which can prevent dust from entering the cooling foils. Therefore, the performance of the memory and the cooling foil will not be affected.

DETAILED DESCRIPTION OF THE PREFERRED EMBODIMENTS

The primary features and characteristics of the present invention are described in detail in the following specific embodiments. Any person having ordinary skill in the art would readily understand the technical features and advantages of the present invention. In addition, the present invention can be realized in different particular embodiments. All such modifications and alterations without departing from the spirit of the present invention are considered within the scope of the present invention.

Figure 1:
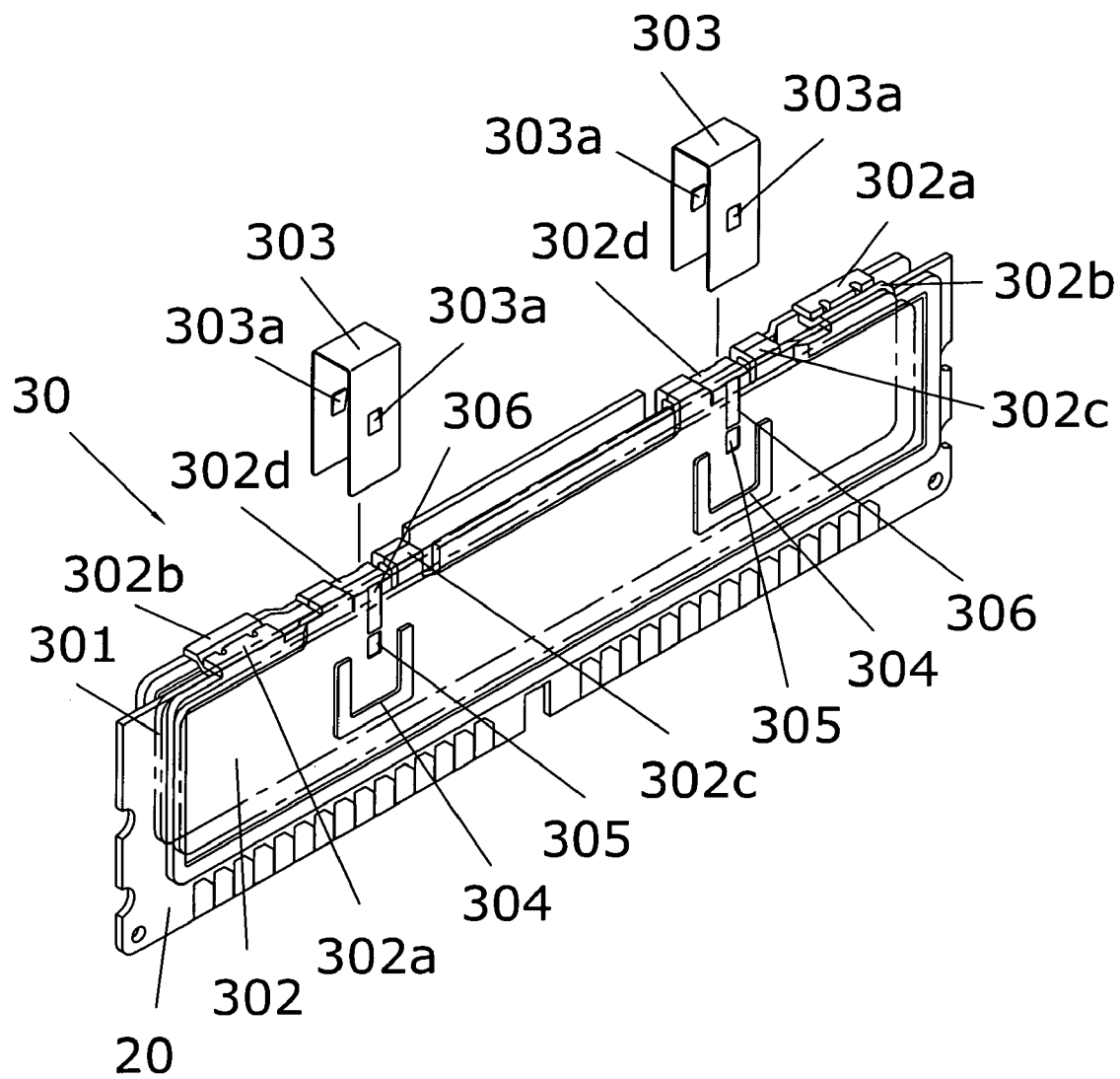
FIG. 1 is a perspective view illustrating a conventional memory cooling device.
Figure 2:
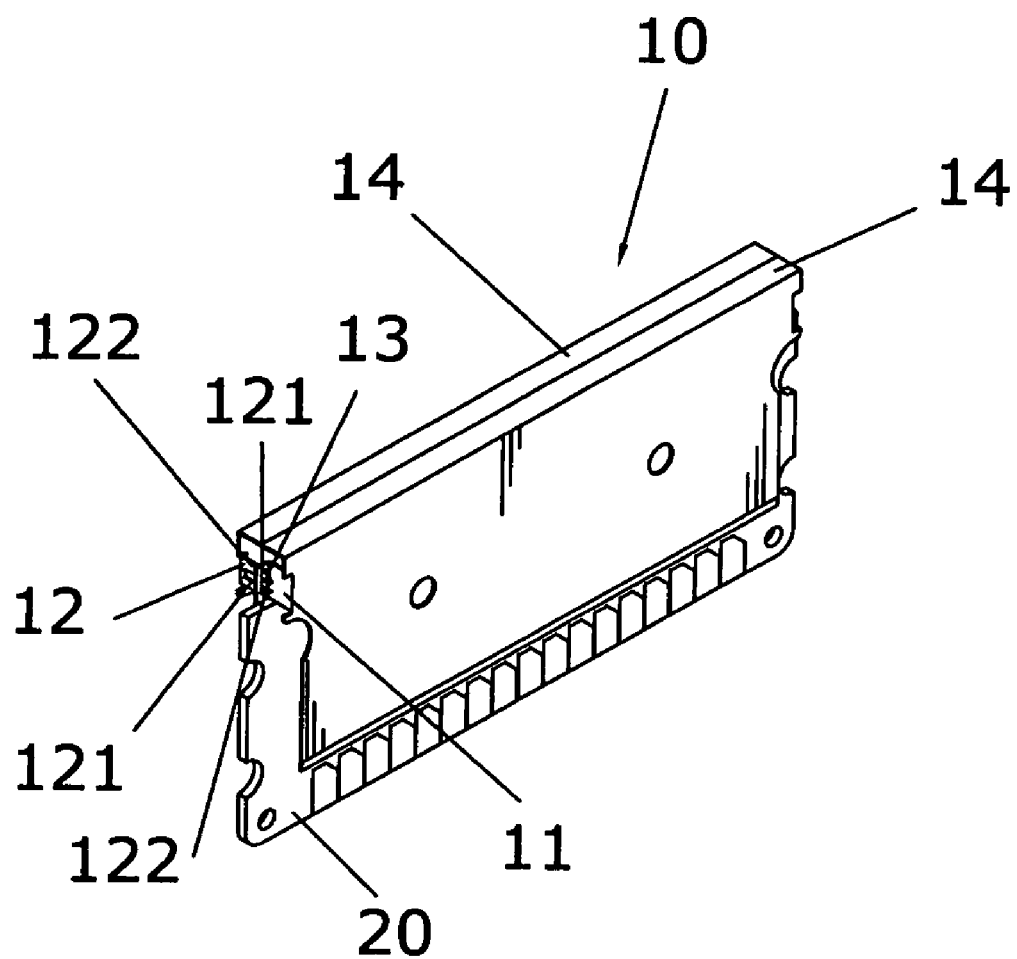
FIG. 2 is a perspective view illustrating a memory cooling device of the present invention.
Figure 3:
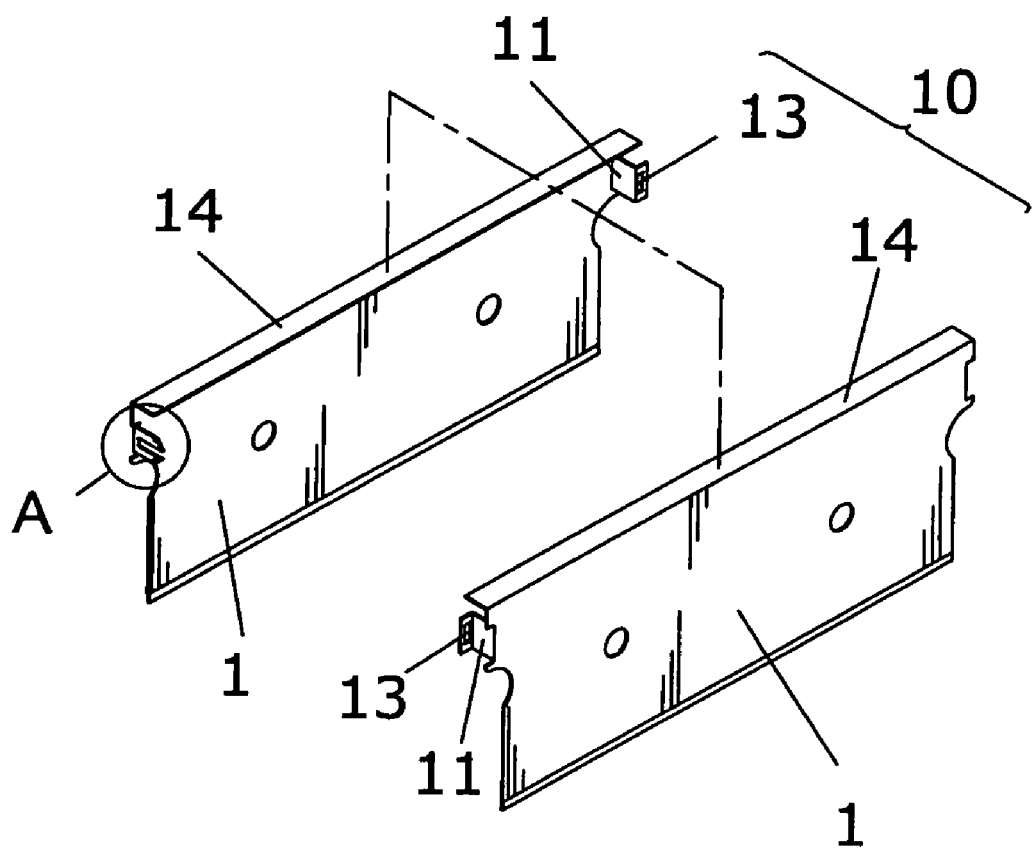
FIG. 3 is an explosive view illustrating the memory cooling device of the present invention.
Figure 4:
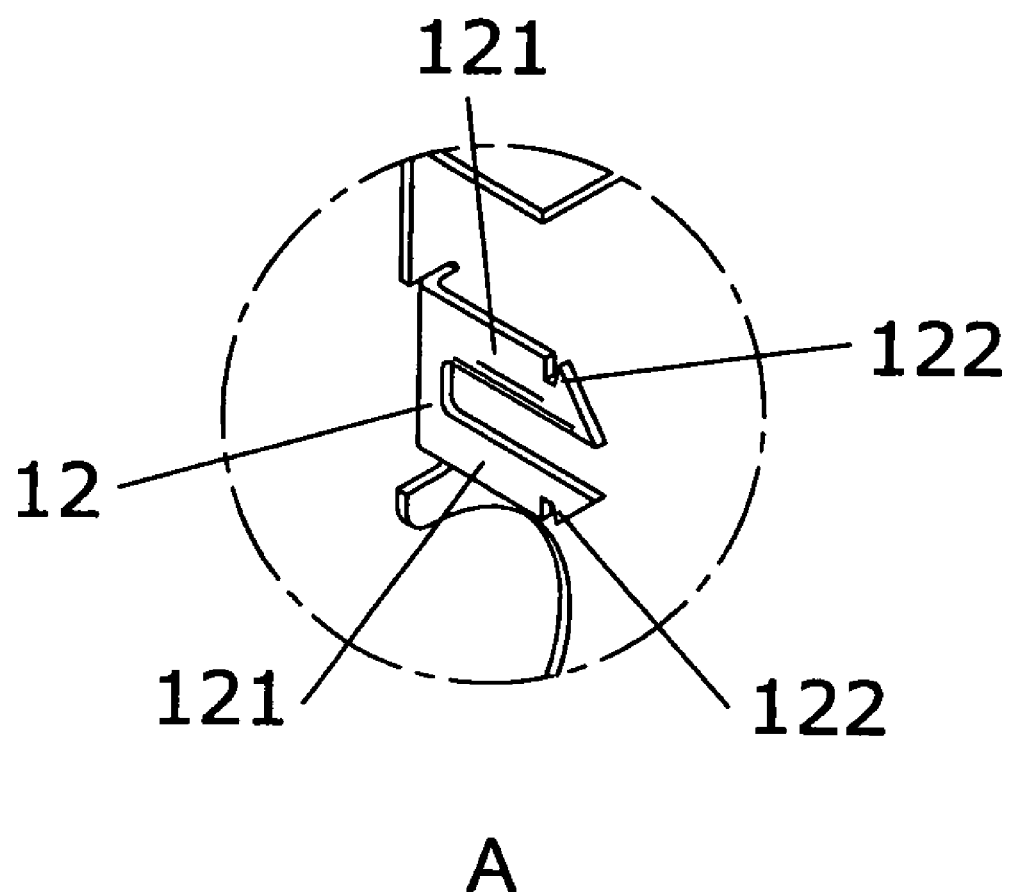
FIG. 4 is a partially enlarged view of region A in FIG. 3.

Referring to FIG. 2 to FIG. 4, a perspective view, an explosive view and a partially enlarged view of a memory cooling device 10 of the present invention are illustrated. The memory cooling device 10 of the present invention includes two cooling foils 1 symmetrically clipping a memory 20 therebetween. The inner surfaces of the two cooling foils 1 adhere to the two sides of the memory 20. A pair of folded portions 11 are formed on the cooling foils 1. The folded portions 11 include a buckling element 12 and a buckling hole 13. The buckling hole 13 and the folded portion 11 are perpendicular to each other. The buckling element 12 further includes two insertion foils 121, which are extended outward to define protrusive portions 122. In this manner, when the insertion foils 121 are inserted into their corresponding buckling holes 13, the protrusive portions 122 touch the side wall of the buckling hole 13. The memory cooling device 10 of the present invention is, thus, assembled. In addition, a pair of dust-proof flanges 14 are formed on the upper portion of the cooling foil 1, so as to prevent dust from entering the cooling foils 1. Therefore, the performance of the memory 26 and the cooling foils 1 will not be affected.

The process for assembling the memory cooling device 10 of the present invention is hereinafter described. First, the two cooling foils 1 are connected to the memory 20, thereby contacting the two inner surfaces of the cooling foils 1 to the memory 20. Then, the buckling elements 12 and the buckling holes 13 formed on the folded portions 11 of the two cooling foils 1 are buckled with each other. Meanwhile, the two insertion foils 121 of the buckling elements 12 are inserted to the corresponding buckling holes 13. The protrusive portions 122 of the insertion foils 121 touch and lock on the side walls of the buckling holes 13. Now, the dust-proof flange 14 formed on the upper portion of the cooling foils 1 are closely overlapped, thereby preventing dust from entering the cooling foils 1. Thus, the performance of the memory 20 and the cooling foils 1 is not affected by dust in the environment.

Accordingly, the memory cooling device 10 of the present invention is advantageous in the following aspects:

1. By employing the buckling elements 12 and the buckling holes 13 formed on the folded portions 11 of the cooling foils 1, one can simplify the process for fabricating and assembling the memory cooling device 10 of the present invention.

2. The dust-proof flanges 14 of the cooling foils 1 can prevent dust from intruding the gap between the memory 20 and cooling foil 1.

In summary, the memory cooling device 10 of the present invention is advantageous over the conventional art.

While the invention has been described by means of specific embodiments, numerous modifications and variations could be made thereto by those skilled in the art without departing from the scope and spirit of the invention set forth in the following claims.

What is claimed is:

1. A memory cooling device comprising two symmetrically formed cooling foils sandwiching a memory, with inner surfaces of the two cooling foils touching two sides of the memory, wherein at least a folded portion is formed on the cooling foils, the folded portion including a buckling element and a buckling hole formed thereon, with the buckling hole including a side wall, and the buckling element comprises at least two insertion foils, the insertion foils being extended outward for defining a protrusive portion, whereby the protrusive portion touches the side wall of the buckling hole when the insertion foils are inserted into the buckling hole.

2. The memory cooling device as recited in claim 1, wherein each cooling foil further comprises a dust-proof flange folded inward on the cooling foil.

\* \* \* \* \*